(12) United States Patent
Lee et al.

(10) Patent No.: US 11,935,573 B2
(45) Date of Patent: Mar. 19, 2024

(54) MAGNETIC MEMORY DEVICES HAVING MULTIPLE MAGNETIC LAYERS THEREIN

(71) Applicant: Samsung Electronics Co., Ltd., Suwon-si (KR)

(72) Inventors: Sung Chul Lee, Osan-si (KR); Ung Hwan Pi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 24 days.

(21) Appl. No.: 17/735,931

(22) Filed: May 3, 2022

(65) Prior Publication Data

US 2022/0262419 A1 Aug. 18, 2022

Related U.S. Application Data

(63) Continuation of application No. 16/828,429, filed on Mar. 24, 2020, now Pat. No. 11,348,626.

(30) Foreign Application Priority Data

Aug. 16, 2019 (KR) .................. 10-2019-0100451

(51) Int. Cl.
*G11C 11/16* (2006.01)
*H10B 61/00* (2023.01)
(Continued)

(52) U.S. Cl.
CPC ............ *G11C 11/161* (2013.01); *H10B 61/00* (2023.02); *H10N 50/10* (2023.02); *H10N 50/80* (2023.02)

(58) Field of Classification Search
CPC .............. G11C 11/161; G11C 11/1673; G11C 11/1675; G11C 11/18; G11C 19/0833; H10B 61/00; H10N 50/10; H10N 50/80
See application file for complete search history.

(56) References Cited

U.S. PATENT DOCUMENTS 7,629,637 B2 12/2009 Kajiyama et al.
7,710,769 B2 5/2010 Cowburn et al.
(Continued)

FOREIGN PATENT DOCUMENTS

CN 108154990 A 6/2018
JP 2016086048 A 5/2016
(Continued)

OTHER PUBLICATIONS

Yang, et al., Domain-wall velocities of up to 750 m s-1 driven by exchange-coupling torque in synthetic antiferromagnets. Nature Nanotech 10, 221-226 (2015) (Year: 2015).*

(Continued)

*Primary Examiner* — Shih Tsun A Chou
(74) *Attorney, Agent, or Firm* — Myers Bigel, P.A.

(57) ABSTRACT

A magnetic memory device includes a first magnetic layer extending in a first direction, a second magnetic layer that extends on and parallel to the first magnetic layer, and a conductive layer extending between the first magnetic layer and the second magnetic layer. The first magnetic layer includes a first region having magnetic moments oriented in a first rotational direction along the first direction. The second magnetic layer includes a second region having magnetic moments oriented in a second rotational direction along the first direction. The second rotational direction is different from the first rotational direction.

20 Claims, 9 Drawing Sheets

(3 of 9 Drawing Sheet(s) Filed in Color)

(51) Int. Cl.
  *H10N 50/10* (2023.01)
  *H10N 50/80* (2023.01)

(56) References Cited

U.S. PATENT DOCUMENTS

| | | |
|---|---|---|
| 8,115,238 B2 | 2/2012 | Lim et al. |
| 8,514,619 B2 | 8/2013 | Hwang |
| 9,293,184 B2 | 3/2016 | O'Grady et al. |
| 9,324,403 B2 | 4/2016 | Khalili Amiri et al. |
| 10,008,248 B2 | 6/2018 | Buhrman et al. |
| 10,062,449 B2 | 8/2018 | Choe |
| 2016/0056368 A1 | 2/2016 | Parkin et al. |
| 2016/0099404 A1 | 4/2016 | Hu et al. |
| 2016/0254046 A1 | 9/2016 | Ranjan et al. |
| 2018/0114898 A1 | 4/2018 | Lee |
| 2018/0190899 A1 | 7/2018 | Kim et al. |
| 2019/0081236 A1 | 3/2019 | Camsari et al. |
| 2020/0006628 A1* | 1/2020 | O'Brien ............ H01F 10/3272 |

FOREIGN PATENT DOCUMENTS

| | | |
|---|---|---|
| JP | 2017168514 A | 9/2017 |
| KR | 100999975 B1 | 12/2010 |
| KR | 101104413 B1 | 1/2012 |
| KR | 20190020547 A | 3/2019 |
| KR | 101976791 B1 | 5/2019 |
| WO | 2008143381 A1 | 11/2008 |
| WO | 2017160893 A1 | 9/2017 |

OTHER PUBLICATIONS

Yang et al. "Domain-wall velocities of up to 750 ms-1 driven by exchange-coupling torque in synthetic antiferromagnets" Nature Nanotechnology 10:221-226 (Mar. 2015).

Dejong et al. "Analytic theory for the switch from Bloch to Néel domain wall in nanowires with perpendicular anisotropy" Physical Review B 92(21):214420-1-214420-12 (Dec. 2015).

Duine et al. "Synthetic Antiferromagnetic Spintronics" Nat. Phys. 14(3):217-219 (Mar. 2018).

* cited by examiner

MAGNETIC MEMORY DEVICES HAVING MULTIPLE MAGNETIC LAYERS THEREIN

REFERENCE TO PRIORITY APPLICATION

This application is a continuation of and claims priority to U.S. patent application Ser. No. 16/828,429, filed Mar. 24, 2020, which claims priority under 35 U.S.C. § 119 to Korean Patent Application No. 10-2019-0100451, filed Aug. 16, 2019, the disclosures of which are hereby incorporated herein by reference.

BACKGROUND

The present inventive concepts relate to a magnetic memory device, and more particularly, to a magnetic memory device that uses the motion of magnetic domain walls to influence data storage within the memory device.

As electronic devices trend toward higher speed and lower power consumption, high-speed read/write operations and low operating voltages are also required for memory devices incorporated therein. In order to meet these requirements, magnetic memory devices have been developed as highly integrated memory devices. Since a magnetic memory device can operate at high speed and can have nonvolatile characteristics, it has attracted considerable attention as a next-generation memory technology. For example, new magnetic memory devices have recently been studied and developed to use the motion of magnetic domain walls in magnetic materials.

SUMMARY

Some example embodiments of the present inventive concepts provide a magnetic memory device whose magnetic domain walls are easy to move.

Some other example embodiments of the present inventive concepts provide a magnetic memory device that requires a reduced current for the motion of magnetic domain walls.

According to some example embodiments of the present inventive concepts, a magnetic memory device may including a first magnetic layer, which extends in a first direction, and a second magnetic layer, which extends on the first magnetic layer. The second magnetic layer extends parallel to the first magnetic layer, and a conductive layer extends between the first magnetic layer and the second magnetic layer. The first magnetic layer may include a first region, which has magnetic moments oriented in a first rotational direction along the first direction. The second magnetic layer may include a second region, which has magnetic moments oriented in a second rotational direction along the first direction. In some embodiments, the second rotational direction may be different from the first rotational direction.

According to some example embodiments of the present inventive concepts, a magnetic memory device may include a first magnetic layer, a second magnetic layer on the first magnetic layer, and a conductive layer extending between the first magnetic layer and the second magnetic layer. A DMI constant at an interface between the first magnetic layer and the conductive layer and at an interface between the second magnetic layer and the conductive layer may be four times (or more) an exchange coupling constant between the first magnetic layer and the second magnetic layer.

According to some further embodiments of the present inventive concepts, a magnetic memory device may include a first magnetic layer including a first magnetic domain and a second magnetic domain that are adjacent to each other in a first direction. The first and second magnetic domains can have magnetization directions different from each other. A second magnetic layer is also provided, which includes a third magnetic domain and a fourth magnetic domain that are on the first magnetic layer. The third and fourth magnetic domains respectively facing the first and second magnetic domains. A conductive layer is provided, which extends between the first magnetic layer and the second magnetic layer. The first and third magnetic domains may have magnetization directions opposite to each other, and the second and fourth magnetic domains may have magnetization directions opposite to each other. The first magnetic layer may further include a first region between the first and second magnetic domains. The first region may have a net magnetization in the first direction. The second magnetic layer may further include a second region between the third and fourth magnetic domains. The second region may have a net magnetization in a direction the same as the first direction.

DETAILED DESCRIPTION OF EMBODIMENTS

The following will now describe in detail some example embodiments of the present inventive concepts with reference to the accompanying drawings.

The patent or application file contains at least one drawing executed in color. Copies of this patent or patent application publication with color drawing(s) will be provided by the Office upon request and payment of the necessary fee.

Figure 1:
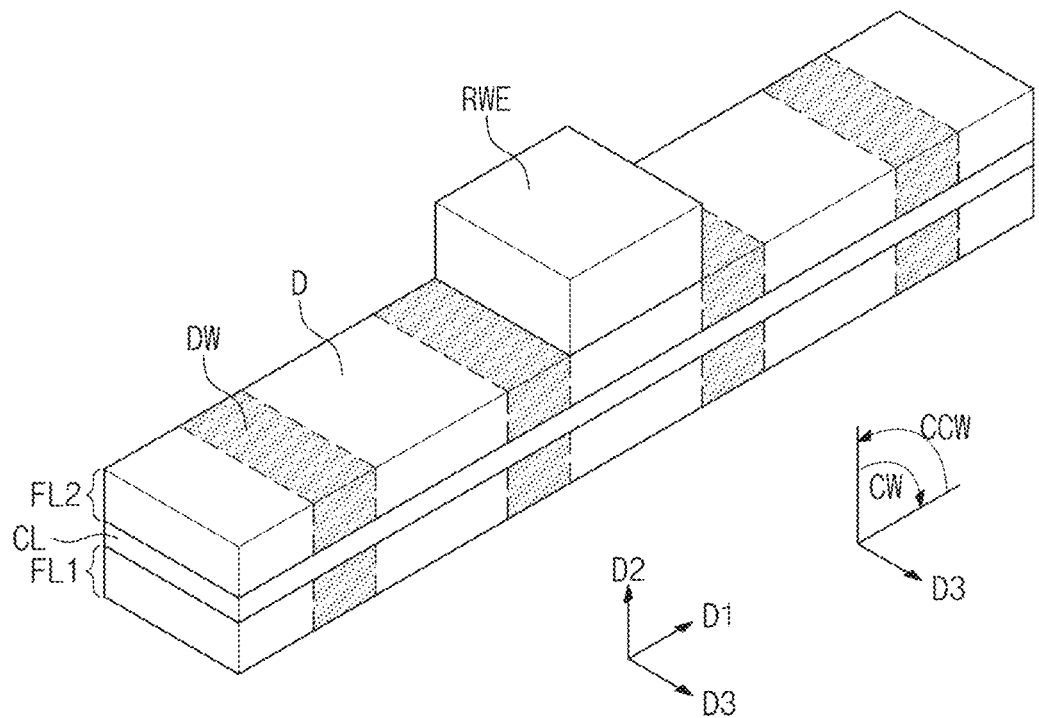
FIG. 1 illustrates a simplified perspective view showing a magnetic memory device according to some example embodiments of the present inventive concepts.

FIG. 1 illustrates a simplified perspective view showing a magnetic memory device according to some example embodiments of the present inventive concepts.

Referring to FIG. 1, a magnetic memory device may include a magnetic track and a read/write element RWE. The magnetic track may include magnetic domains D arranged along an extending direction of the magnetic track and magnetic domain walls DW between the magnetic domains D. The magnetic domain D may be a region where a magnetic moment is aligned in a certain direction, and the magnetic domain wall DW may be a region where a magnetic moment is changed in direction. The magnetic memory device may include data storage components that utilize principles of magnetic domain wall motion.

The read/write element RWE may be disposed adjacent to the magnetic track. The read/write element RWE may change a magnetization direction of the magnetic domain D disposed closest thereto. In addition, the read/write element RWE may detect the magnetization direction of the magnetic domain D disposed closest thereto. For example, the read/write element RWE may include either a GMR sensor that uses a giant magnetoresistance effect or a TMR sensor that uses a tunnel magnetoresistance effect. Differently from what is shown, the read/write element RWE may include a read element and a write element that are independently configured of each other, and the read element and the write element may be positioned on the magnetic domains D different from each other.

The magnetic track may include a first magnetic layer FL1, a second magnetic layer FL2, and a conductive layer CL between the first and second magnetic layers FL1 and FL2. The magnetic track may have an elongated wire or track shape. For example, the magnetic track may have a linear shape that extends parallel to a first direction D1. The present inventive concepts, however, are not limited thereto, and the magnetic track may have a partially curved shape. For example, the magnetic track may include a U-shaped curved portion in some other embodiments of the invention.

The first and second magnetic layers FL1 and FL2 may be stacked in a direction perpendicular to an extending direction of the magnetic track. Each of the first and second magnetic layers FL1 and FL2 may extend in the first direction D1. The first and second magnetic layers FL1 and FL2 may be stacked in a second direction D2 perpendicular to the first direction D1. For example, a top surface of the first magnetic layer FL1 and a bottom surface of the second magnetic layer FL2 may face each other in the second direction D2. Each of the first and second magnetic layers FL1 and FL2 may have a width in a third direction D3 greater than a width in the second direction D2. Each of the first and second magnetic layers FL1 and FL2 may have a length in the first direction D1 greater than the thickness in the second direction D2 and the width in the third direction D3.

The conductive layer CL may be disposed between the first and second magnetic layers FL1 and FL2. The conductive layer CL may be interposed between the top surface of the first magnetic layer FL1 and the bottom surface of the second magnetic layer FL2. The conductive layer CL may have a uniform thickness in the second direction D2 and may extend parallel to the first and second magnetic layers FL1 and FL2. The thickness in the second direction D2 of the conductive layer CL may be less than those of the first and second magnetic layers FL1 and FL2. The conductive layer CL may cover the top surface of the first magnetic layer FL1 and the bottom surface of the second magnetic layer FL2. In this case, the conductive layer CL may be in direct contact with the first and second magnetic layers FL1 and FL2.

Figure 2:
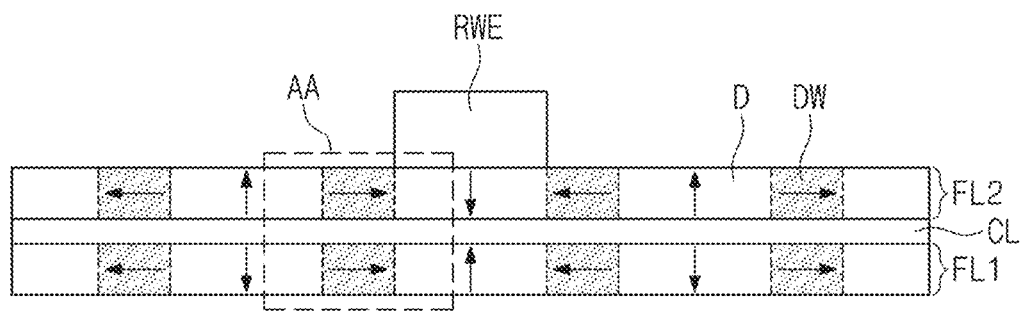
FIG. 2 illustrates a cross-sectional view showing a magnetic memory device according to some example embodiments of the present inventive concepts.
Figure 2:
Figure 3:
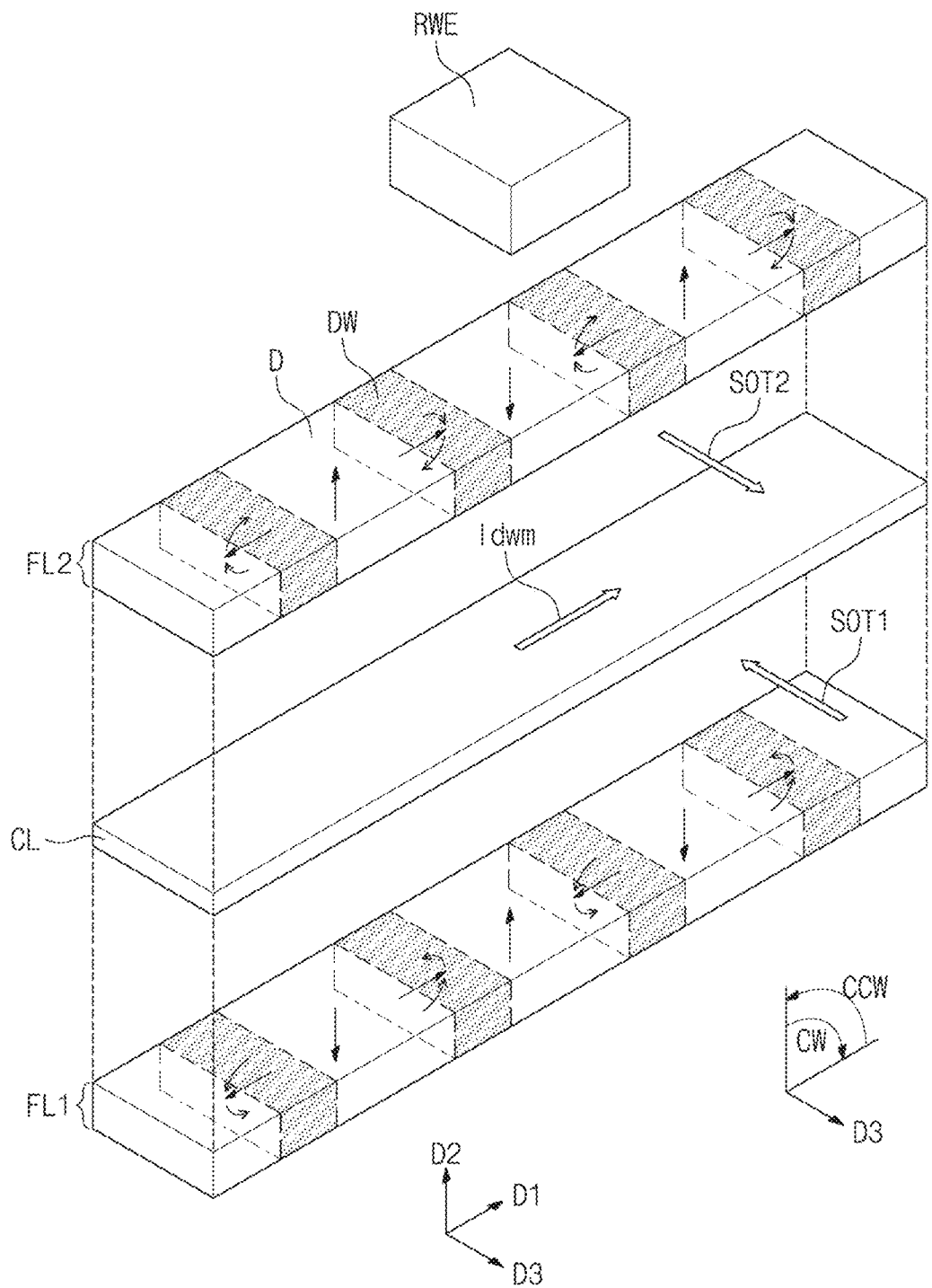
FIG. 3 illustrates an exploded perspective view roughly showing a magnetic memory device according to some example embodiments of the present inventive concepts

FIG. 2 illustrates a cross-sectional view showing a magnetic memory device according to some example embodiments of the present inventive concepts. FIG. 3 illustrates an exploded perspective view roughly showing a magnetic memory device according to some example embodiments of the present inventive concepts.

Referring to FIGS. 2 and 3, the magnetic domains D of the first and second magnetic layers FL1 and FL2 may have their perpendicular magnetic anisotropy (PMA) set. For example, the magnetic domains D of the first and second magnetic layers FL1 and FL2 may have their magnetization directions set to extend parallel to the second direction D2. The magnetic domains D of the first and second magnetic layers FL1 and FL2 may have a synthetic anti-ferromagnetic structure (SAF). The magnetic domains D of the first and second magnetic layers FL1 and FL2 may have an antiferromagnetic coupling property caused by a Ruderman-Kittel-Kasuya-Yosida (RKKY) interaction.

For example, the magnetic domains D of the first magnetic layer FL1 face in the second direction D2 toward the magnetic domains D of the second magnetic layer FL2. The magnetic domain D of the first magnetic layer FL1 may have a magnetization direction set antiparallel to that of the magnetic domain D of the second magnetic layer FL2. The magnetic domains D of the first and second magnetic layers FL1 and FL2 are adjacent to each other in the second direction D2. In this case, the magnetic direction of the magnetic domain D of the first magnetic layer FL1 may be opposite to that of the magnetic domain D of the second magnetic layer FL2, as shown by FIG. 2. Therefore, the magnetic track may decrease in saturation magnetization, and may require a reduced current for the motion of the magnetic domain wall DW.

Each of the first and second magnetic layers FL1 and FL2 may include one or more of cobalt (Co), iron (Fe), and nickel (Ni). Each of the first and second magnetic layers FL1 and FL2 may further include at least one of non-magnetic materials, such as boron (B), zinc (Zn), aluminum (Al), titanium (Ti), ruthenium (Ru), tantalum (Ta), silicon (Si), silver (Ag), gold (Au), copper (Cu), carbon (C), and nitrogen (N). For example, each of the first and second magnetic layers FL1 and FL2 may include one or more of FePt, FePd, CoCr, CoCu, CoPt, CoTb, CoCrPt, CoFeTb, CoFeGd, CoNi, and CoNiFe. The first and second magnetic layers FL1 and FL2 may include the same material.

The magnetic domain walls DW of the first magnetic layer FL1 may face in the second direction D2 toward the magnetic domain walls DW of the second magnetic layer FL2. The magnetic domain walls DW of the first and second magnetic layers FL1 and FL2 may each have a net magnetization parallel to the first direction D1. A magnetization direction of the magnetic domain wall DW will be further discussed in detail below with reference to FIG. 4.

The first magnetic layer FL1 may have chirality (e.g., a mirror-image geometric property) opposite to that of the second magnetic layer FL2. For example, the first magnetic layer FL1 may have a magnetic moment oriented in a first rotational direction clockwise (CW) along the first direction D1, and the second magnetic layer FL2 may have a magnetic moment oriented in a second rotational direction counter clockwise (CCW) along the first direction D1, which first and second rotational directions CW and CCW are different from each other. The first and second rotational directions CW and CCW may be opposite to each other. The first rotational direction CW and the second rotational direction CCW may respectively be a clockwise direction and a counterclockwise direction that have their rotation axes parallel to the third direction D3.

The conductive layer CL may be interposed between the first magnetic layer FL1 and the second magnetic layer FL2. The conductive layer CL may have a bottom surface in contact with the top surface of the first magnetic layer FL1 and a top surface in contact with the bottom surface of the second magnetic layer FL2. The conductive layer CL may have a thickness in the second direction D2 that is less than the thicknesses in the second direction D2 of the first and second magnetic layers FL1 and FL2.

A spin orbit coupling may be created by a current flowing through the conductive layer CL. For example, the conductive layer CL may include a material in which a spin Hall effect or a Rashba effect may be produced by a current flowing in a direction parallel to the first direction D1. The conductive layer CL may include a heavy metal whose atomic number is 30 or higher. The conductive layer CL may include, for example, iridium (Ir), ruthenium (Ru), tantalum (Ta), platinum (Pt), palladium (Pd), bismuth (Bi), titanium (Ti), or tungsten (W).

A current flowing in a direction parallel to the first direction D1 through the conductive layer CL may drive the magnetic domain walls DW to move in the first direction D1 or in a direction opposite to the first direction D1. A motion direction SDWM of the magnetic domain wall DW may be determined by multiplication of a sign SST of spin torque coefficient and a sign SJ of applied current. The sign SST of spin torque coefficient may be given by multiplication of a sign SSOT of spin orbit torque and a sign SDMI of Dzyaloshinskii-Moriya Interaction (DMI) constant. As a result, the motion direction SDWM of the magnetic domain wall DW may be determined by Equation 1 below.

$$S_{DWM} = S_{ST} \times S_J = S_{SOT} \times S_{DMI} \times S_J \quad \text{[Equation 1]}$$

When a current flows in a direction parallel to the first direction D1 through the conductive layer CL, a direction of spin orbit torque SOT1 at an interface between the first magnetic layer FL1 and the conductive layer CL may be opposite to that of spin orbit torque SOT2 at an interface between the second magnetic layer FL2 and the conductive layer CL. Because the first and second magnetic layers FL1 and FL2 have their chiralities opposite to each other as discussed above, when a current flows in a direction parallel to the first direction D1 through the conductive layer CL, the motion direction of the magnetic domain wall DW of the first magnetic layer FL1 may become the same as that of the magnetic domain wall DW of the second magnetic layer FL2.

A DMI constant at an interface between the first magnetic layer FL1 and the conductive layer CL may be greater than or equal to four times or more an exchange coupling constant between the first magnetic layer FL1 and the second magnetic layer FL2. A DMI constant at an interface between the second magnetic layer FL2 and the conductive layer CL maybe greater than or equal to four times or more an exchange coupling constant between the first magnetic layer FL1 and the second magnetic layer FL2. The DMI constant at an interface between the first magnetic layer FL1 and the conductive layer CL and at an interface between the second magnetic layer FL2 and the conductive layer CL may be less than 100 times the exchange coupling constant between the first magnetic layer FL1 and the second magnetic layer FL2.

Figure 4:
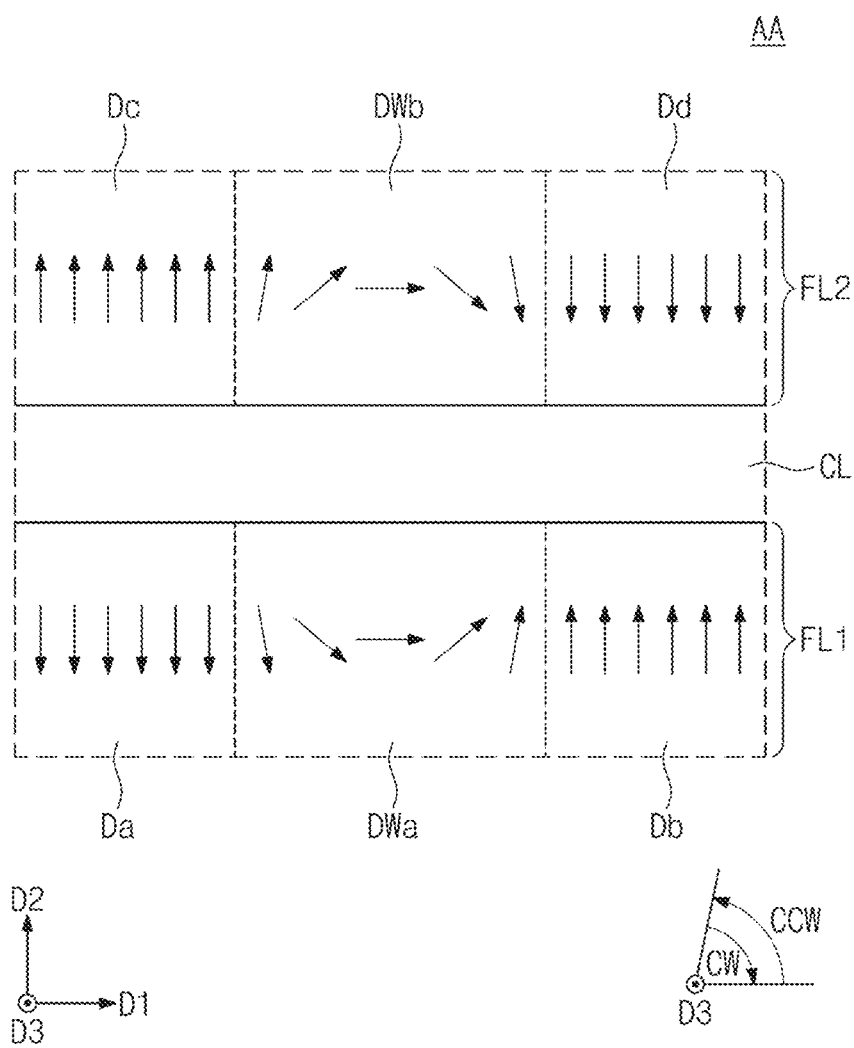
FIG. 4 illustrates an enlarged cross-sectional view showing section AA of FIG. 2.

FIG. 4 illustrates an enlarged cross-sectional view showing section AA of FIG. 3. Referring to FIG. 4, the first magnetic layer FL1 may include a first magnetic domain Da and a second magnetic domain Db that have different magnetization directions from each other. The first and second magnetic domains Da and Db may be spaced apart from each other in the first direction D1. The first magnetic domain Da may have a magnetization direction aligned in the second direction D2. The second magnetic domain Db may have a magnetization direction aligned in a direction opposite to the second direction D2. The first and second magnetic domains Da and Db may have therebetween a first region DWa having a magnetization direction that is changed along the first direction D1. The first region DWa may have a magnetization direction that is gradually oriented in the counterclockwise direction CCW along the first direction D1.

The second magnetic layer FL2 may include a third magnetic domain Dc and a fourth magnetic domain Dd that have different magnetization directions from each other. The third and fourth magnetic domains Dc and Dd may be spaced apart from each other in the first direction D1. The third magnetic domain Dc may be adjacent to the first magnetic domain Da in the second direction. The fourth magnetic domain Dd may be adjacent to the second magnetic domain Db in the second direction. The first and second magnetic layers FL1 and FL2 are combined with each other in a synthetic anti-ferromagnetic coupling manner, the third magnetic domain Dc may have a magnetization direction antiparallel to that of the first magnetic domain Da. The fourth magnetic domain Dd may have a magnetization direction antiparallel to that of the second magnetic domain Db. The third and fourth magnetic domains Dc an Dd may have therebetween a second region DWb having a magnetization direction that is changed along the first direction D1. The magnetization direction of the second region DWb may be gradually oriented in the clockwise direction CW along the first direction D1.

Each of the first and second regions DWa and DWb may be an area which is formed between two zones having different magnetization directions and whose magnetization direction is gradually changed. Each of the first and second regions DWa and DWb may be a magnetic domain wall. Each of the first and second regions DWa and DWb may have a net magnetization in the first direction D1. For example, the first and second regions DWa and DWb may have their net magnetizations in the same direction. In this sense, a sum of magnetization vectors in the first region DWa may be the same as the first direction D1. A sum of magnetization vectors in the second region DWb may be the same as the first direction D1.

FIGS. 5A to 7B illustrate simulation graphs showing a magnetization direction based on DMI and Jex of a magnetic track according to some example embodiments of the present inventive concepts. A magnetic track used in simulation includes a first magnetic layer, a conductive layer, and a second magnetic layer that are sequentially stacked. The magnetic track has a length of 200 nm in a first direction and a width of 14 nm in a second direction. The first magnetic layer, the conductive layer, and the second magnetic layer have respective thicknesses of 1 nm, 0.5 nm, and 1 nm in a third direction.

A Dzyaloshinskii-Moriya interaction (DMI) may be a phenomenon occurring in a ferromagnetic material with broken inversion symmetry and strong spin-orbit coupling is strong. For example, the DMI may be a phenomenon wherein a spin present at an interface of a magnetic layer is coupled to an orbit of an electron present in a non-magnetic layer when the magnetic layer is in contact with an interface of the non-magnetic layer. When the DIM is present, adjacent spin directions may be kept perpendicular. The DMI may produce a spin structure oriented in a spatially specific direction. In FIGS. 5A to 7B below, the DMI indicates a DMI constant at an interface either between the first magnetic layer and the conductive layer or between the second magnetic layer and the conductive layer. The symbol Jex denotes an exchange coupling constant between the first magnetic layer and the second magnetic layer.

Figure 5A:
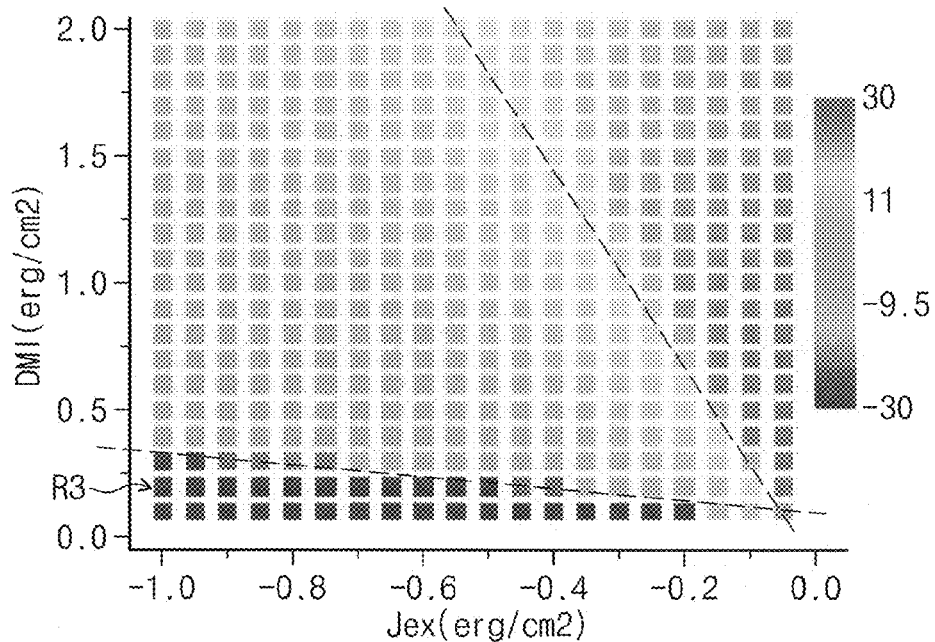
FIGS. 5A-5B, 6A-6B and 7A-7B illustrate simulation graphs showing a magnetization direction based on DMI and Jex of a magnetic track according to some example embodiments of the present inventive concepts.
Figure 5B:
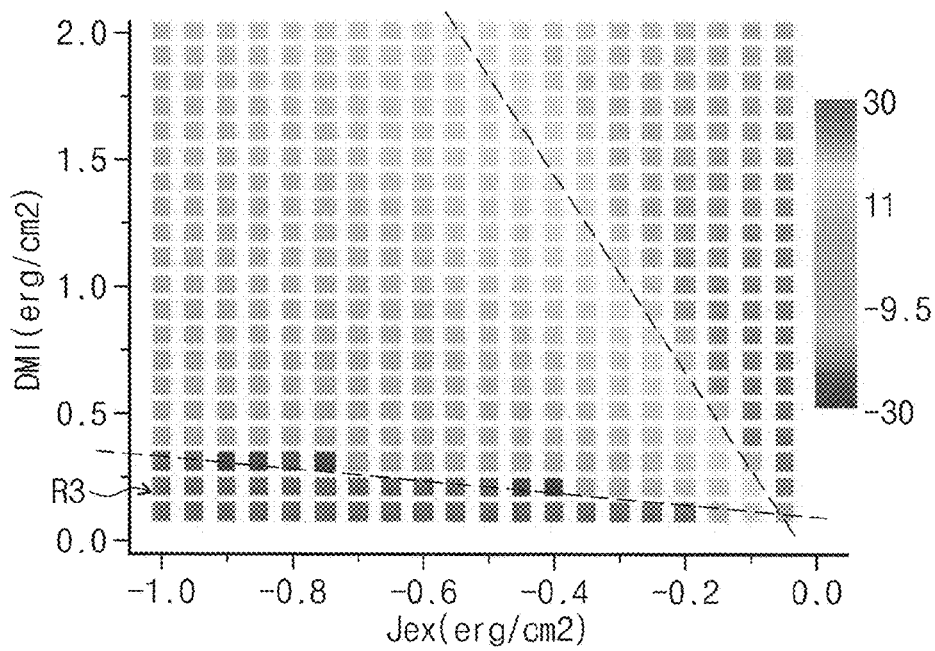
Figure 6A:
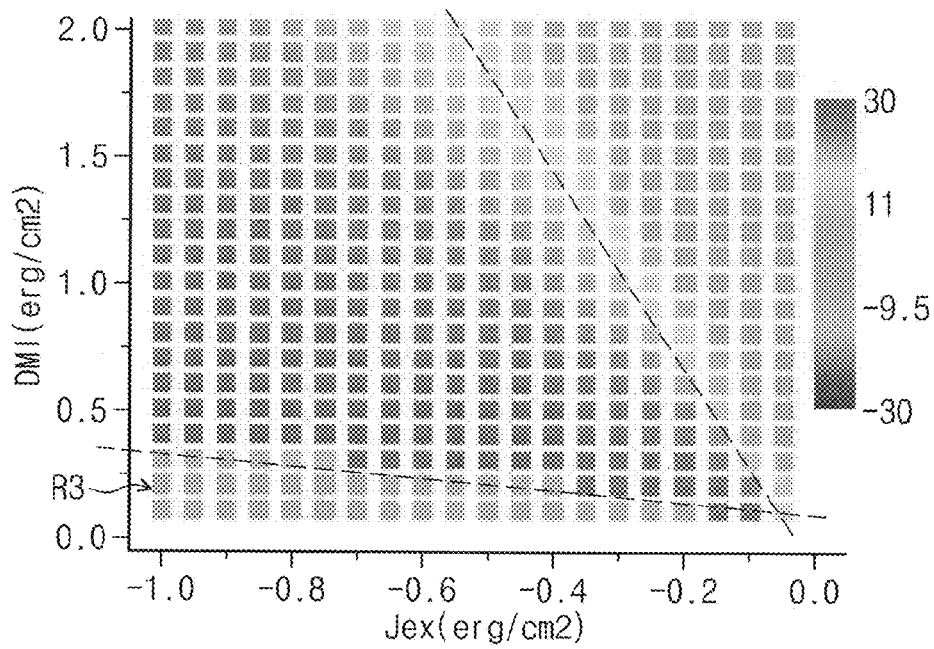
Figure 6B:
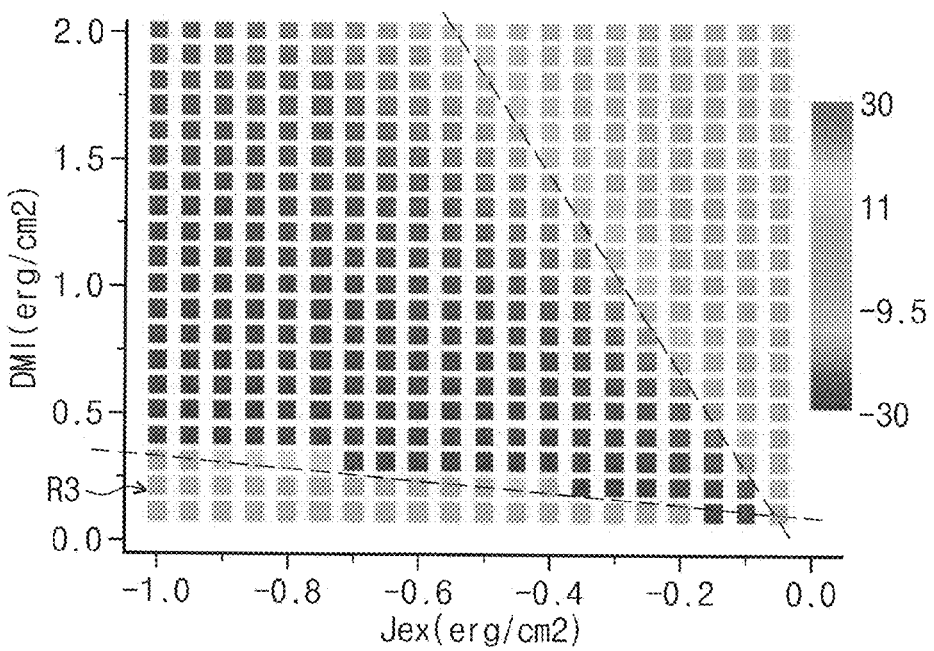
Figure 7A:
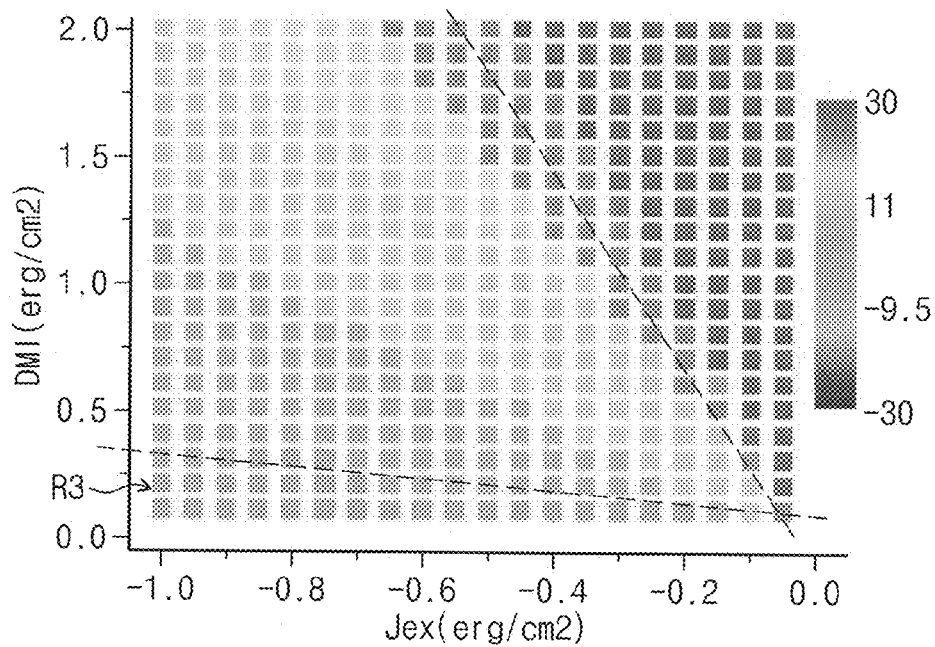
Figure 7B:
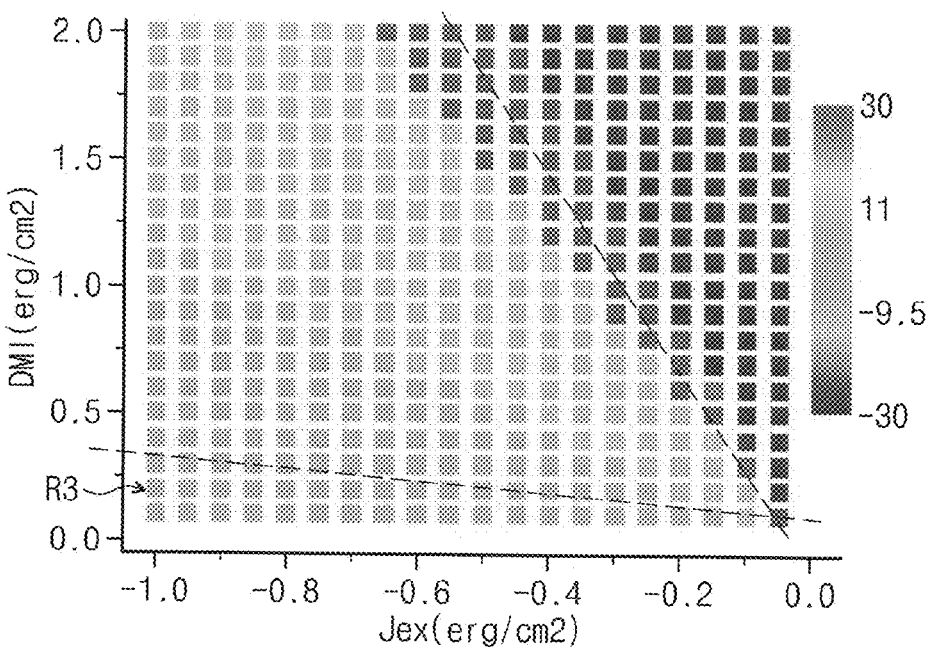

In FIG. 5A, based on DMI and Jex, a magnetization direction of the first magnetic layer was simulated along a first direction (e.g., longitudinal direction). In FIG. 5B, based on DMI and Jex, a magnetization direction of the second magnetic layer was simulated along the first direction (e.g., longitudinal direction). In FIG. 6A, based on DMI and Jex, a magnetization direction of the first magnetic layer was simulated along a second direction (e.g., width direction). In FIG. 6B, based on DMI and Jex, a magnetization direction of the second magnetic layer was simulated along the second direction (e.g., width direction). In FIG. 7A, based on DMI and Jex, a magnetization direction of the first magnetic layer was simulated along a third direction (e.g., thickness direction). In FIG. 7B, based on DMI and Jex, a magnetization direction of the second magnetic layer was simulated along the third direction (e.g., thickness direction).

Referring to FIGS. 5A to 7B, it may be found that there is a tendency of the magnetization direction in accordance with a ratio of DMI to Jex. For example, as shown in the graph, it may be ascertained that a region where an absolute value of DMI/Jex is in a range of greater than 4, of greater than 0.5 and greater than 4, or of less than 0.5 has a similar magnetization direction. The result of simulation may be stated in Table 1 below.

TABLE 1

| $|DMI/Jex|$ | FL1 | FL2 | FL1 | FL2 |
|---|---|---|---|---|
| $|DMI/Jex| > 4$ | Neel | Neel | CW | CCW |
| $4 > |DMI/Jex| > 0.5$ | Bloch | Bloch | — | — |
| $|DMI/Jex| < 0.5$ | Neel | Neel | CCW | CCW |

Referring back to FIGS. 5A to 7B and Table 1, when the DMI constant at an interface between the first magnetic layer and at an interface between the conductive layer and between the second magnetic layer and the conductive layer is four times or more the exchange coupling constant between the first and second magnetic layers, it may be interpreted that the first and second magnetic layers have their Neel magnetic domain wall. In addition, when the DMI constant at an interface between the first magnetic layer and at an interface between the conductive layer and between the second magnetic layer and the conductive layer is four times or more the exchange coupling constant between the first and second magnetic layers, it may be concluded that the first and second magnetic layers have their chiralities opposite to each other.

Accordingly, when the DMI constant at an interface between the first magnetic layer and at an interface between the conductive layer and between the second magnetic layer and the conductive layer is four times or more the exchange coupling constant between the first and second magnetic layers, it may be understood that the magnetic domain walls may move due to spin orbit torque, and that the efficiency of the magnetic domain wall motion may be increased.

Figure 8:
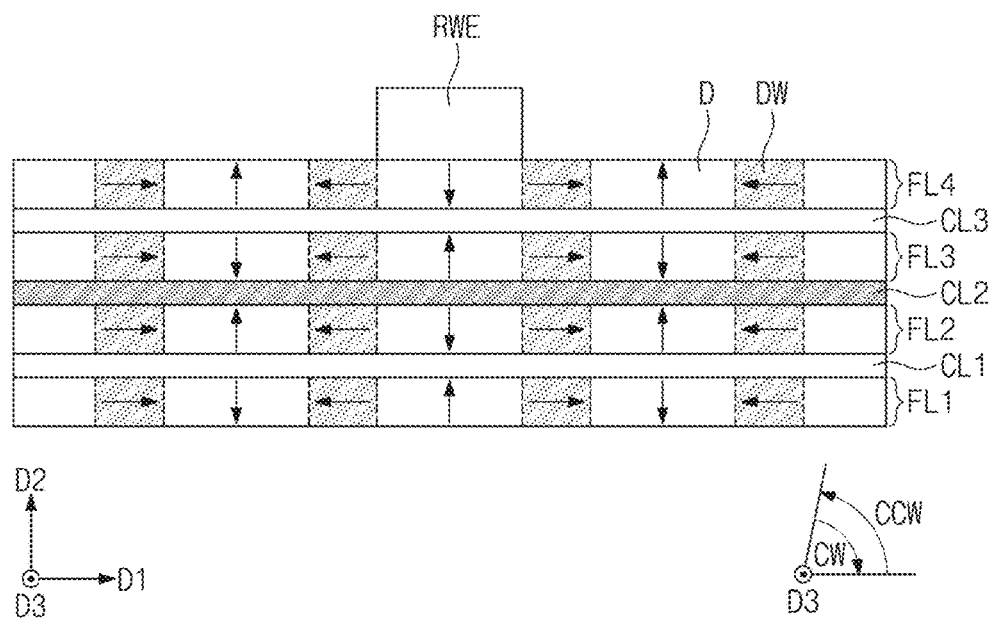
FIG. 8 illustrates a cross-sectional view showing a magnetic memory device according to some example embodiments of the present inventive concepts.

FIG. 8 illustrates a cross-sectional view showing a magnetic memory device according to some example embodiments of the present inventive concepts. Referring to FIG. 8, a magnetic track may include first to fourth magnetic layers FL1 to FL4. A first conductive layer CL1 may be disposed between the first magnetic layer FL1 and the second magnetic layer FL2. A second conductive layer CL2 may be disposed between the second magnetic layer FL2 and the third magnetic layer FL3. A third conductive layer CL3 may be disposed between the third magnetic layer FL3 and the fourth magnetic layer FL4. The first and third conductive layers CL1 and CL3 may include the same material. The second conductive layer CL2 may include a material whose DMI sign is different from that of the material included in the first and third conductive layers CL1 and CL3. For example, the first and third conductive layers CL1 and CL3 may include one of tantalum (Ta) and platinum (Pt), and the second conductive layer CL2 may include the other of tantalum (Ta) and platinum (Pt).

Each of the first to fourth magnetic layers FL1 to FL4 may have chirality opposite to that of other magnetic layer adjacent thereto. For example, when the second magnetic layer FL2 has a magnetization direction oriented in the clockwise direction CW along the first direction D1, the first magnetic layer FL1 and the third magnetic layer FL3 may have their magnetization directions oriented in the counter-clockwise direction CCW along the first direction D1. Because the fourth magnetic layer FL4 is adjacent to the third magnetic layer FL3, the fourth magnetic layer FL4 may have a magnetization direction oriented in the clockwise direction CW along the first direction D1.

Figure 9:
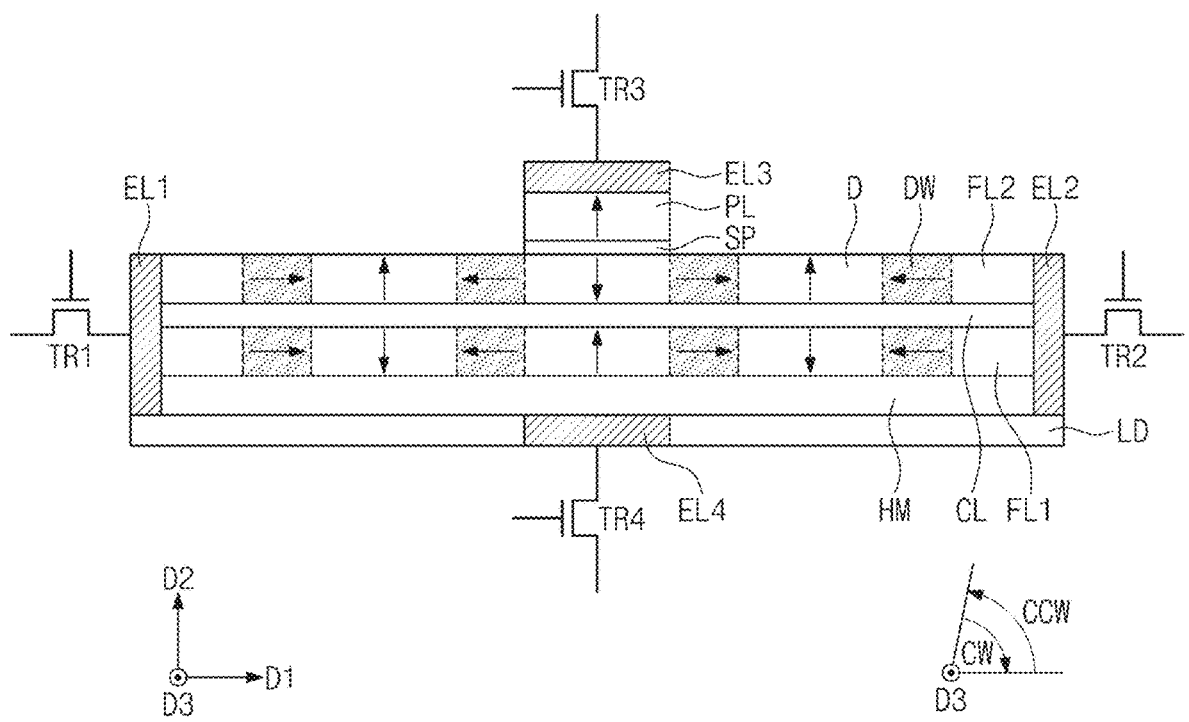
FIGS. 9 to 13 illustrate cross-sectional views showing a magnetic memory device according to some example embodiments of the present inventive concepts.

FIGS. 9 to 13 illustrate cross-sectional views showing a magnetic memory device according to some example embodiments of the present inventive concepts. A description of duplicate components may be omitted in the interest of brevity. Referring to FIG. 9, a magnetic memory device according to some embodiments of the present inventive concepts may be a four-terminal device including four electrodes. A lower conductive layer HM may be disposed on a bottom surface of the magnetic track that includes the first magnetic layer FL1, the conductive layer CL, and the second magnetic layer FL2 that are sequentially stacked. The lower conductive layer HM may include a heavy metal whose atomic number is 30 or higher. The lower conductive layer HM may include, for example, iridium (Ir), ruthenium (Ru), tantalum (Ta), platinum (Pt), palladium (Pd), bismuth (Bi), titanium (Ti), or tungsten (W). A dielectric layer LD may cover a bottom surface of the lower conductive layer HM.

A magnetic pattern PL may be disposed on a top surface of the magnetic track. The magnetic pattern PL may be a reference layer having a magnetization direction that is fixed in one direction. The magnetic pattern PL may have a magnetization direction parallel to that of the magnetic domain D of the second magnetic layer FL2. The magnetization direction of the magnetic pattern PL may be opposite that of one of the magnetic domains D included in the second magnetic layer FL2, which one of the magnetic domains D is most adjacent to the magnetic pattern PL.

A tunnel barrier pattern SP may be disposed between the second magnetic layer FL2 and the magnetic pattern PL. The tunnel barrier pattern SP may include one or more of a magnesium (Mg) oxide layer, a titanium (Ti) oxide layer, an aluminum (Al) oxide layer, a magnesium-zinc (Mg—Zn) oxide layer, and a magnesium-boron (Mg—B) oxide layer.

A first electrode EU may be disposed on one side of the magnetic track. The first electrode EL1 may cover a lateral surface of the lower conductive layer HM, a lateral surface of the first magnetic layer FL1, a lateral surface of the conductive layer CL, and a lateral surface of the second magnetic layer FL2. The magnetic track may have a second electrode EL2 on its other side that faces in the first direction D1 toward the first electrode EL1. The second electrode EL2 may cover other lateral surface of the lower conductive layer HM, other lateral surface of the first magnetic layer FL1, other lateral surface of the conductive layer CL, and other lateral surface of the second magnetic layer FL2.

A third electrode EL3 may be disposed on the magnetic pattern PL. The third electrode EL3 may cover a top surface of the magnetic pattern PL. A fourth electrode EL4 may be disposed on a bottom surface of the first magnetic layer FL1. The fourth electrode EL4 may vertically overlap the third electrode EL3.

First, second, third, and fourth transistors TR1, TR2, TR3, and TR4 may be respectively connected to the first, second, third, and fourth electrodes EL1, EL2, EL3, and EL4. The first and second transistors TR1 and TR2 may be drive transistors that move the magnetic domain wall DW. The first and second transistors TR1 and TR2 may supply the lower conductive layer HM and the conductive layer CL with current flowing in the first direction D1. The lower conductive layer HM and the conductive layer CL that are supplied with the current flowing in the first direction D1 may utilize spin-orbit coupling to advantageously move the magnetic domain wall DW. The third and fourth transistors TR3 and TR4 may write or read magnetization directions into or from the magnetic domains D of the magnetic track.

Figure 10:
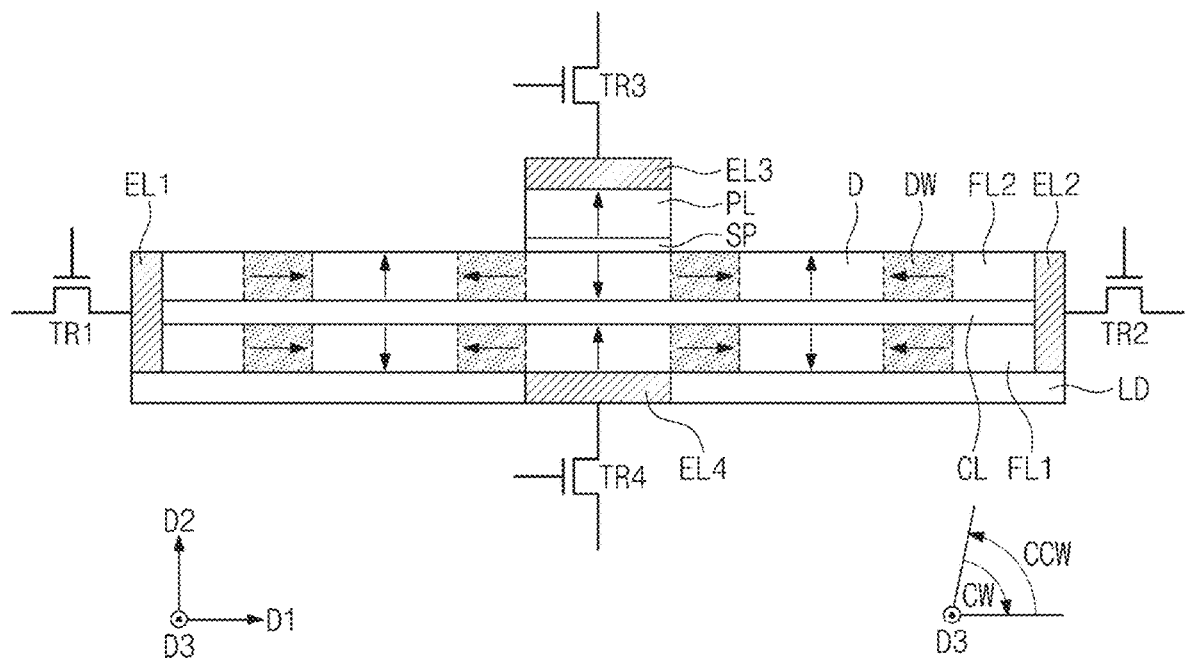
Figure 11:
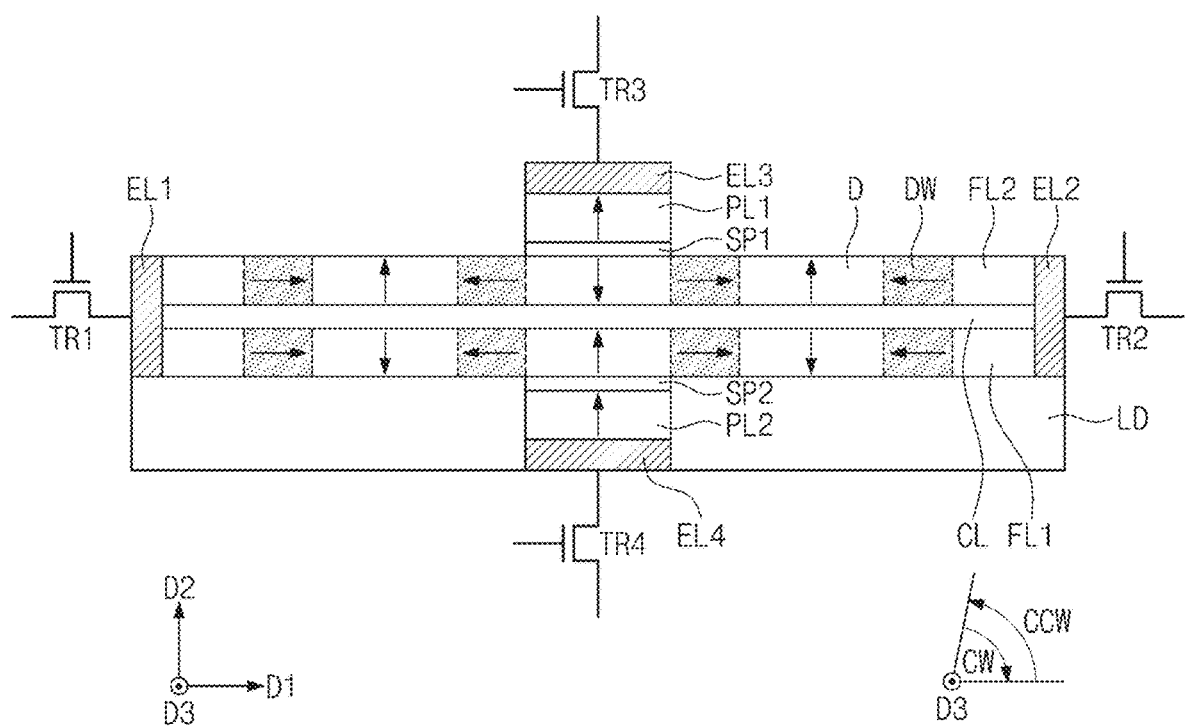

Referring to FIG. 10, the lower conductive layer HM may be omitted. Thus, the bottom surface of the first magnetic layer FL1 may directly contact the dielectric layer LD. Referring to FIG. 11, a first tunnel barrier pattern SP1 and the first magnetic pattern PL1 may be sequentially stacked on a top surface of the second magnetic layer FL2. A second tunnel barrier pattern SP2 and the second magnetic pattern PL2 may be sequentially stacked on the bottom surface of the first magnetic layer FL1. The first and second magnetic patterns PL1 and PL2 may vertically overlap each other. The first and second magnetic patterns PL1 and PL2 may be reference layers that have magnetization directions fixed in one direction. The first and second magnetic patterns PL1 and PL2 may have their magnetization directions in the second direction D2.

The third electrode EL3 may be disposed on a top surface of the first magnetic pattern PL1, and the fourth electrode EL4 may be disposed on a bottom surface of the second magnetic pattern PL2. The third and fourth transistors TR3 and TR4 may be respectively disposed on the third and fourth electrodes EL3 and EL4.

Figure 12:
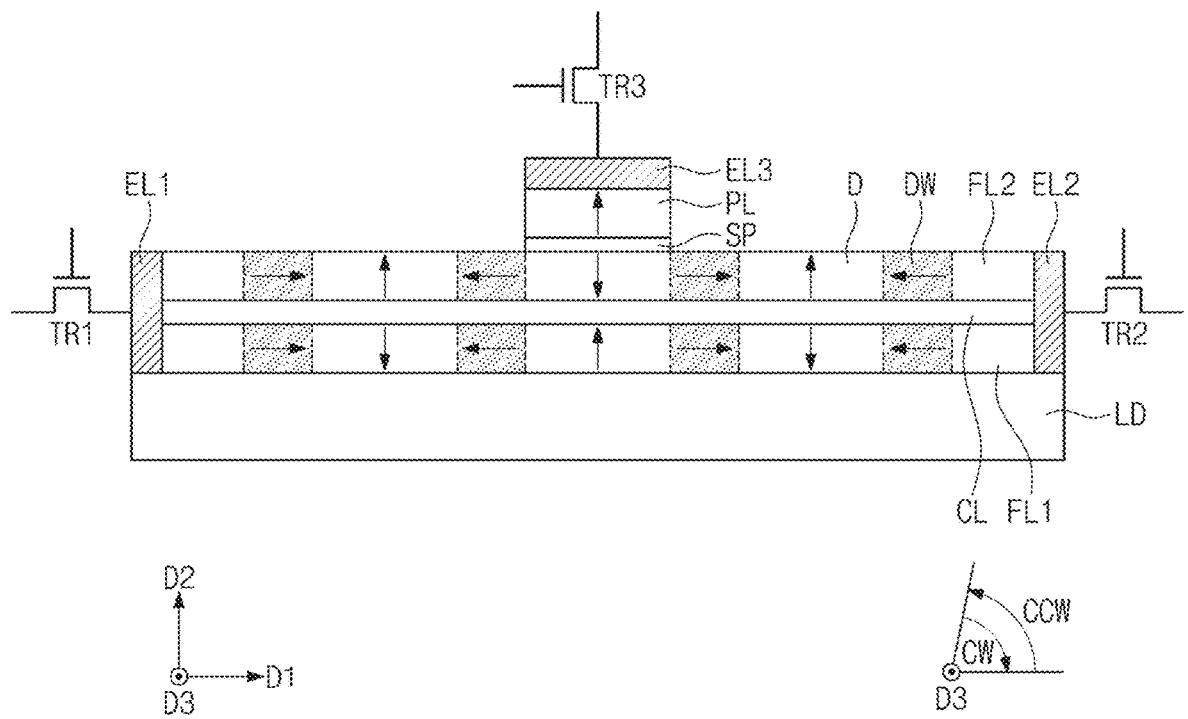
Figure 13:
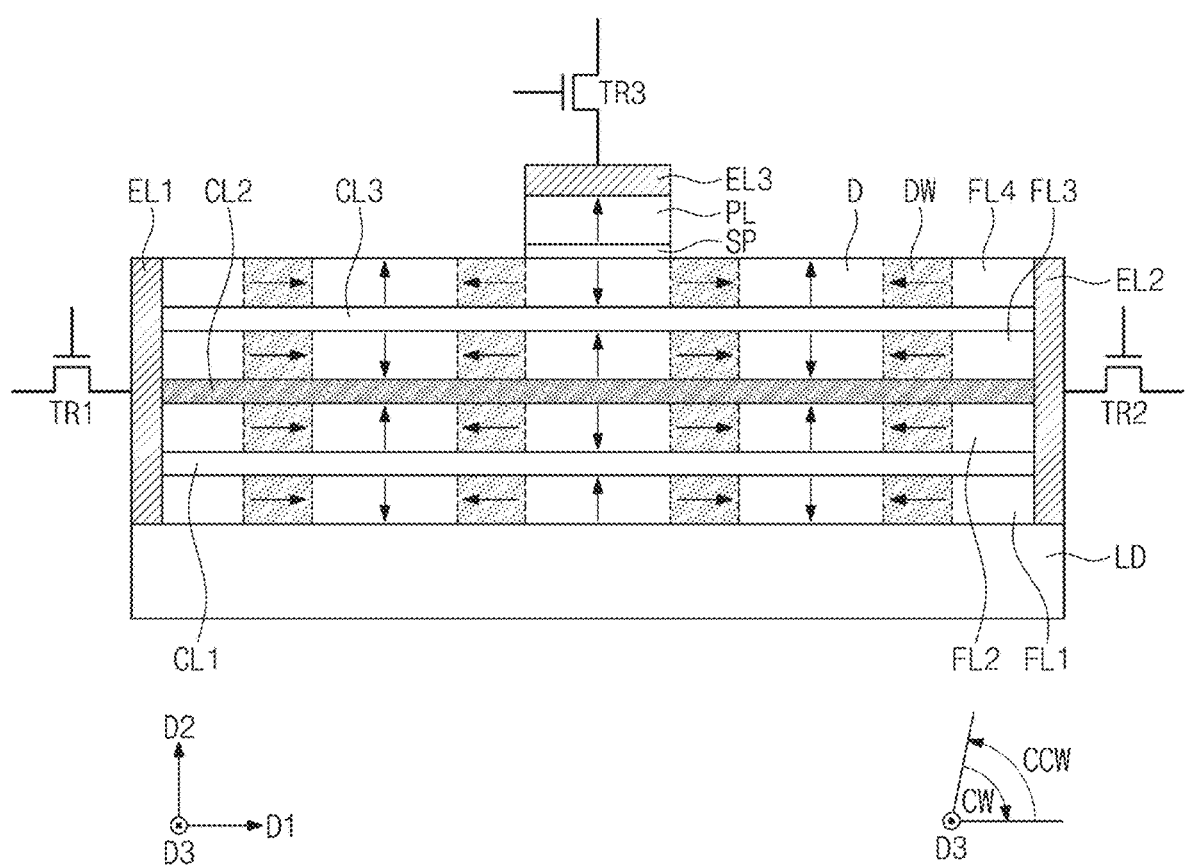

Referring to FIGS. 12 and 13, a magnetic memory device according to some embodiments of the present inventive concepts may be a three-terminal device. Referring to FIG. 12, a dielectric layer LD may completely cover a bottom surface of the first magnetic layer FL1. Referring to FIG. 13, the magnetic track may include first to fourth magnetic layers FL1 to FL4 that are sequentially stacked in the second direction D2. A first conductive layer CL1 may be disposed between the first magnetic layer FL1 and the second magnetic layer FL2. A second conductive layer CL2 may be disposed between the second magnetic layer FL2 and the third magnetic layer FL3. A third magnetic layer CL3 may be disposed between the third magnetic layer FL3 and the fourth magnetic layer FL4. The first and third conductive layers CL1 and CL3 may include the same material. The second conductive layer CL2 may include a material whose DMI sign is different from that of the material of the first and third conductive layers CL1 and CL3.

A first electrode EL1 may be disposed covering lateral surfaces of the first to fourth magnetic layers FL1 to FL4 and of the first to third conductive layers CL1 to CL3. A second electrode EL2 may be disposed covering other lateral surfaces of the first to fourth magnetic layers FL1 to FL4 and of the first to third conductive layers CL1 to CL3. First, second, and third transistors TR1, TR2, and TR3 may be respectively connected to first, second, and third electrodes EL1, EL2, and EL3. The first and second transistors TR1 and TR2 may supply the first to third conductive layers CL1 to CL3 with current flowing in a direction parallel to the first direction D1. The current applied to the first to third conductive layers EL1, EL2, and EL3 may create spin orbit torque to move the magnetic domain wall DW of the magnetic track. In this case, the magnetic domain walls DW of the first to fourth magnetic layers FL1 to FL4 may all move in the same direction.

According to the present inventive concepts, a magnetic track of a magnetic memory device may have a synthetic anti-ferromagnetic structure and may include a plurality of magnetic layers having chiralities opposite to each other. Accordingly, it may be possible to easily move the magnetic domain walls and to reduce the magnitude of current required for the motion of the magnetic domain walls.

Although some example embodiments of the present inventive concepts have been discussed with reference to accompanying figures, it will be understood that various changes in form and details may be made therein without departing from the spirit and scope of the present inventive concepts. It therefore will be understood that the embodiments described above are just illustrative but not limitative in all aspects.

What is claimed is:

1. A magnetic memory device, comprising:
    a first magnetic layer extending in a first direction, the first magnetic layer including a first region having magnetic moments oriented in a first rotational direction along the first direction;
    a second magnetic layer on the first magnetic layer and extending in the first direction, the second magnetic layer including a second region having magnetic moments oriented in a second rotational direction along the first direction, the second rotational direction is opposite to the first rotational direction;
    a conductive layer, which extends in the first direction between the first magnetic layer and the second magnetic layer and is configured to support current flow in the first direction between the first and second magnetic layers, from a first end of the conductive layer to a second end of the conductive layer;
    an upper magnetic layer on the second magnetic layer, the upper magnetic layer having a magnetization direction fixed in one direction; and
    a tunnel barrier pattern between the upper magnetic layer and the second magnetic layer.

2. The magnetic memory device of claim 1, further comprising:
    a first electrode on the first end of the conductive layer; and
    a second electrode on the second end of the conductive layer,
    wherein the first end is opposite to the second end in the first direction.

3. The magnetic memory device of claim 2, further comprising:
    a third electrode on the upper magnetic layer,
    wherein the upper magnetic layer is between the tunnel barrier pattern and the third electrode.

4. The magnetic memory device of claim 3, further comprising:
    a fourth electrode on a bottom surface of the first magnetic layer, the fourth electrode vertically overlapping the third electrode.

5. The magnetic memory device of claim 1, the conductive layer is a first conductive layer;
    the device further comprising a second conductive layer, a third magnetic layer, a third conductive layer, and a fourth magnetic layer that are sequentially stacked on the second magnetic layer and extend in the first direction, wherein the upper magnetic layer on the fourth magnetic layer, and the tunnel barrier pattern between the upper magnetic layer and the fourth magnetic layer, and wherein the third magnetic layer including a third region having magnetic moments oriented in the first rotational direction along the first direction, and the fourth magnetic layer including a fourth region having magnetic moments oriented in the second rotational direction along the first direction.

6. The magnetic memory device of claim 5, wherein the second conductive layer includes a material different from materials of the first and third conductive layers.

7. The magnetic memory device of claim 1, wherein a Dzyaloshinskii-Moriya Interaction constant at an interface between the first magnetic layer and the conductive layer and at an interface between the second magnetic layer and the conductive layer is at least four times a value of an exchange coupling constant between the first magnetic layer and the second magnetic layer.

8. The magnetic memory device of claim 1, wherein a net magnetization of each of the first and second regions becomes oriented parallel to the first direction in response to the current flow in the first direction within the conductive layer.

9. The magnetic memory device of claim 1, wherein the first and second regions face each other in a second direction orthogonal to the first direction; and wherein a net magnetization of the first region and a net magnetization of the second region are oriented in a same direction.

10. The magnetic memory device of claim 1, wherein the conductive layer has a thickness less than thicknesses of the first and second magnetic layers.

11. The magnetic memory device of claim 1, wherein the conductive layer is supplied with current in the first direction within the conductive layer to create spin orbit torque at an interface between the first magnetic layer and the conductive layer and at an interface between the second magnetic layer and the conductive layer; and wherein the current flows parallel to the interface between the first magnetic layer and the conductive layer and parallel to the interface between the second magnetic layer and the conductive layer.

12. The magnetic memory device of claim 11, wherein the spin orbit torque at the interface between the first magnetic layer and the conductive layer has a direction opposite to a direction of the spin orbit torque at the interface between the second magnetic layer and the conductive layer.

13. The magnetic memory device of claim 1, wherein the first rotational direction is a clockwise rotational direction around a rotational axis, which extends parallel to a width direction of the conductive layer, and the second rotational direction is a counterclockwise rotational direction around the rotational axis.

14. A magnetic memory device, comprising:
a first magnetic layer extending in a first direction, the first magnetic layer including a first region having magnetic moments oriented in a first rotational direction along the first direction;

a second magnetic layer on the first magnetic layer and extending in the first direction, the second magnetic layer including a second region having magnetic moments oriented in a second rotational direction along the first direction, the second rotational direction is opposite to the first rotational direction;

a conductive layer, which extends in the first direction between the first magnetic layer and the second magnetic layer and is configured to support current flow in the first direction between the first and second magnetic layers; and a read/write element on the second magnetic layer, wherein a Dzyaloshinskii-Moriya Interaction constant at an interface between the first magnetic layer and the conductive layer and at an interface between the second magnetic layer and the conductive layer is at least four times a value of an exchange coupling constant between the first magnetic layer and the second magnetic layer.

15. The magnetic memory device of claim 14, wherein the read/write element includes a GMR sensor or a TMR sensor.

16. The magnetic memory device of claim 14, further comprising:
a first electrode on a first lateral surface of the conductive layer; and
a second electrode on a second lateral surface of the conductive layer, the second lateral surface opposite to the first lateral surface in the first direction.

17. The magnetic memory device of claim 14, the conductive layer is a first conductive layer;
the device further comprising a second conductive layer, a third magnetic layer, a third conductive layer, and a fourth magnetic layer that are sequentially stacked on the second magnetic layer and extend in the first direction, wherein the read/write element on the fourth magnetic layer, and wherein the third magnetic layer including a third region having magnetic moments oriented in the first rotational direction along the first direction, and the fourth magnetic layer including a fourth region having magnetic moments oriented in the second rotational direction along the first direction.

18. The magnetic memory device of claim 17, wherein the second conductive layer includes a material different from materials of the first and third conductive layers.

19. The magnetic memory device of claim 14, wherein the conductive layer is supplied with current in the first direction within the conductive layer to create spin orbit torque at an interface between the first magnetic layer and the conductive layer and at an interface between the second magnetic layer and the conductive layer; and wherein the current flows parallel to the interface between the first magnetic layer and the conductive layer and parallel to the interface between the second magnetic layer and the conductive layer.

20. The magnetic memory device of claim 19, wherein the spin orbit torque at the interface between the first magnetic layer and the conductive layer has a direction opposite to a direction of the spin orbit torque at the interface between the second magnetic layer and the conductive layer.

* * * * *